(12) United States Patent
Ali et al.

(10) Patent No.: US 6,704,918 B1
(45) Date of Patent: Mar. 9, 2004

(54) INTEGRATED CIRCUIT ROUTING

(75) Inventors: Anwar Ali, London (GB); Virendra Patel, Middlesex (GB)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/311,981

(22) Filed: May 14, 1999

(30) Foreign Application Priority Data

May 15, 1998 (GB) .............................................. 9810604

(51) Int. Cl.[7] .............................................. G06F 17/50
(52) U.S. Cl. .......................................... 716/12; 716/16
(58) Field of Search ............................. 716/12, 13, 14, 716/15, 16

(56) References Cited

U.S. PATENT DOCUMENTS

| | | | | |
|---|---|---|---|---|
| 4,484,292 A | * | 11/1984 | Hong et al. .................. | 716/13 |
| 4,636,965 A | * | 1/1987 | Smith et al. .................. | 716/12 |
| 5,544,069 A | * | 8/1996 | Mohsen ....................... | 716/16 |
| 5,638,288 A | | 6/1997 | Deeley ......................... | 716/13 |
| 6,260,184 B1 | * | 7/2001 | Brennan ....................... | 716/14 |

FOREIGN PATENT DOCUMENTS

WO    WO 92/10809    6/1992    .................. 15/60

* cited by examiner

Primary Examiner—Trong Phan
(74) Attorney, Agent, or Firm—Mitchell, Silberberg & Knupp, LLP

(57) ABSTRACT

A technique is described for enabling routing of metallisation wires over sensitive cells of an integrated circuit by means of a global router after the cell circuits have been designed. At least one cell includes dedicated route paths (32, 36, 40, 46) as part of the cell design. The paths may include alternative paths (32 and 36), and concurrently usable paths (40 and 46). By including the routes as part of the cell design, the subsequent problems of a global routing tool routing wires over sensitive areas of the cell can be avoided, and the number of wire routes can be controlled. The global router operates by detecting whether dedicated routes are provided and, if so, identifying the entry/exit points for routes to be used.

30 Claims, 4 Drawing Sheets

INTEGRATED CIRCUIT ROUTING

FIELD OF THE INVENTION

This invention relates to determining suitable routing for connecting "wires" in integrated circuits.

BACKGROUND OF THE INVENTION

Integrated circuits are normally designed as a plurality of functional circuit cells, including, for example, memory cells, buffer cells, analog circuit cells, logic cells, etc. In an integrated circuit, connections between different cells are provided by "wires" which are conductive paths which may extend through or past one or more cells to provide connections in the integrated circuit on a more global scale. The wires are normally implemented as tracks in one or more layers of metallisation on the semiconductor substrate.

Dedicated routing software tools are available for routing the wires on the integrated circuit. Once the topography of the individual cells has been designed, the router operates to determine the paths across the integrated circuit of the connecting wires on a global scale.

Problems can occur if wires are routed over or adjacent to certain areas of sensitive cells, such as analog cells or memory cells. Interference can occur between the circuit of the cell and the signals in the wire, causing incorrect circuit performance.

With conventional routers, it is possible to "block out" certain sensitive cells from the router, such that the router will not route any wires over the blocked cells. This can avoid the interference problems mentioned above, but it does result in reduced availability for wire routes within the integrated circuit. This is referred to as low cell "porosity". If a designer is very cautious in the design of an integrated circuit, he may block out all of the potentially sensitive cells, which can lead to the router operating very slowly, or even having insufficient routing room to provide paths for all of the necessary wires. If the router fails, the designer will either have to un-block some of the cells, or he will have to define the wire routes manually, which is a very difficult and labour intensive task.

As die sizes become larger, and the number of mixed signal and sensitive cell devices in integrated circuits continues to increase, the problem of global signal routing over such cells and components is becoming more apparent.

SUMMARY OF THE INVENTION

The present invention has been devised bearing the above problems in mind.

In contrast to the prior art, one aspect of the present invention is to define at least one circuit cell having at least one wire route and/or at least one possible wire route defined as part of the cell.

The invention enables advantage to be taken of the fact that, even for sensitive cells, there may be one or more possible wire routes through the cell without the wire coming close to sensitive areas circuitry of the cell. By building such wire routes, or possible wire routes, in to the cell at the cell-design level, it is not necessary to block out the entire cell to the routing software. Instead, the routing software can access the allowable routes through the cell as part of the overall routing design.

Furthermore, the designer can determine the number of wire routes which are permissible through the cell. In the prior art technique, a cell is either transparent in that any number of wire routes can be placed through the cell, or it is blocked out, meaning that no wire routes are allowed. With the new technique, the cell designer can control the number of wire routes available to the router software.

A further advantage is that the cell designer can design suitable routes through the cell for differential signal wires, such that each wire is subject to the same interference. Alternatively, the effect of a signal within a wire, on differential signals within the cell, can be predicted and utilised to provide wire routes through sensitive areas of the cell.

DESCRIPTION OF THE DRAWINGS

An embodiment of the invention is now described by way of example only, with reference to the accompanying drawings, in which.

DESCRIPTION OF PREFERRED EMBODIMENTS

Figure 1:
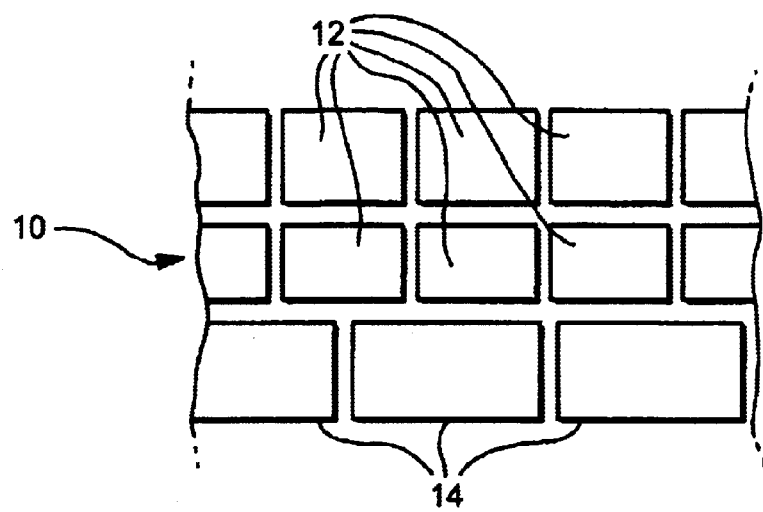
FIG. 1 is a schematic diagram showing a plurality of cells in an integrated circuit.

Referring to FIG. 1, a portion 10 of an integrated circuit is shown schematically. The portion 10 consists of a number of memory circuit cells 12, and a number of addressing logic cells 14. The memory cells 12 are highly sensitive to the routing of wires through the cells 12.

Figure 2:
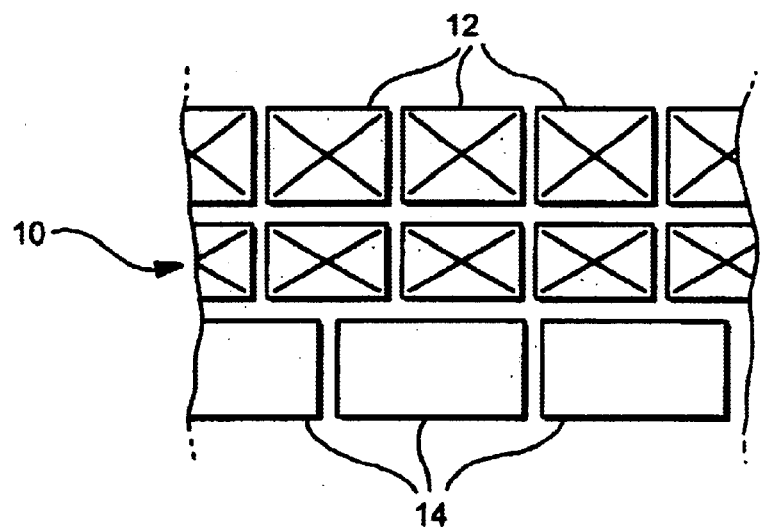
FIG. 2 is a schematic diagram similar to FIG. 1, illustrating sensitive cells blocked out for a conventional router.

FIG. 2 illustrates how the cells 12 might be handled using a conventional router program. Typically the sensitive memory cells 12 would be blocked out from the router program, to prevent wires from being routed through, and risk interfering with, the memory cells 12. As can be seen in FIG. 2, the blocking out of all of the memory cells 12 severely limits the room available to the router to route wires through the region 10 of the integrated circuit.

Figure 3:
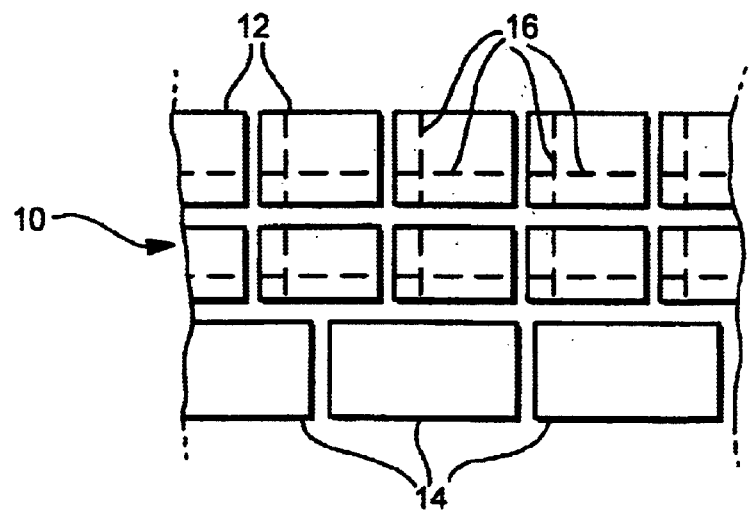
FIG. 3 is a schematic diagram similar to FIG. 1, illustrating possible routes built in at cell-design level.

Referring to FIG. 3, in accordance with the principles of this embodiment, each memory cell 12 includes, at cell design level, one or more possible safe wire routes 16 through the cell 12. The routes 16 are designed to bypass the most sensitive areas of the cell 12. Generally each cell 12 will include a plurality of different possible wire routes, for example, for different metallisation layers. Some of the different routes may used concurrently, while others may be used as alternatives to each other. By using safe routes which are built in to each cell 12, the "porosity" of the cells can be increased, thereby providing greater room for the router, more efficient layout of the wires, and greater flexibility for the routing software.

Figure 4:
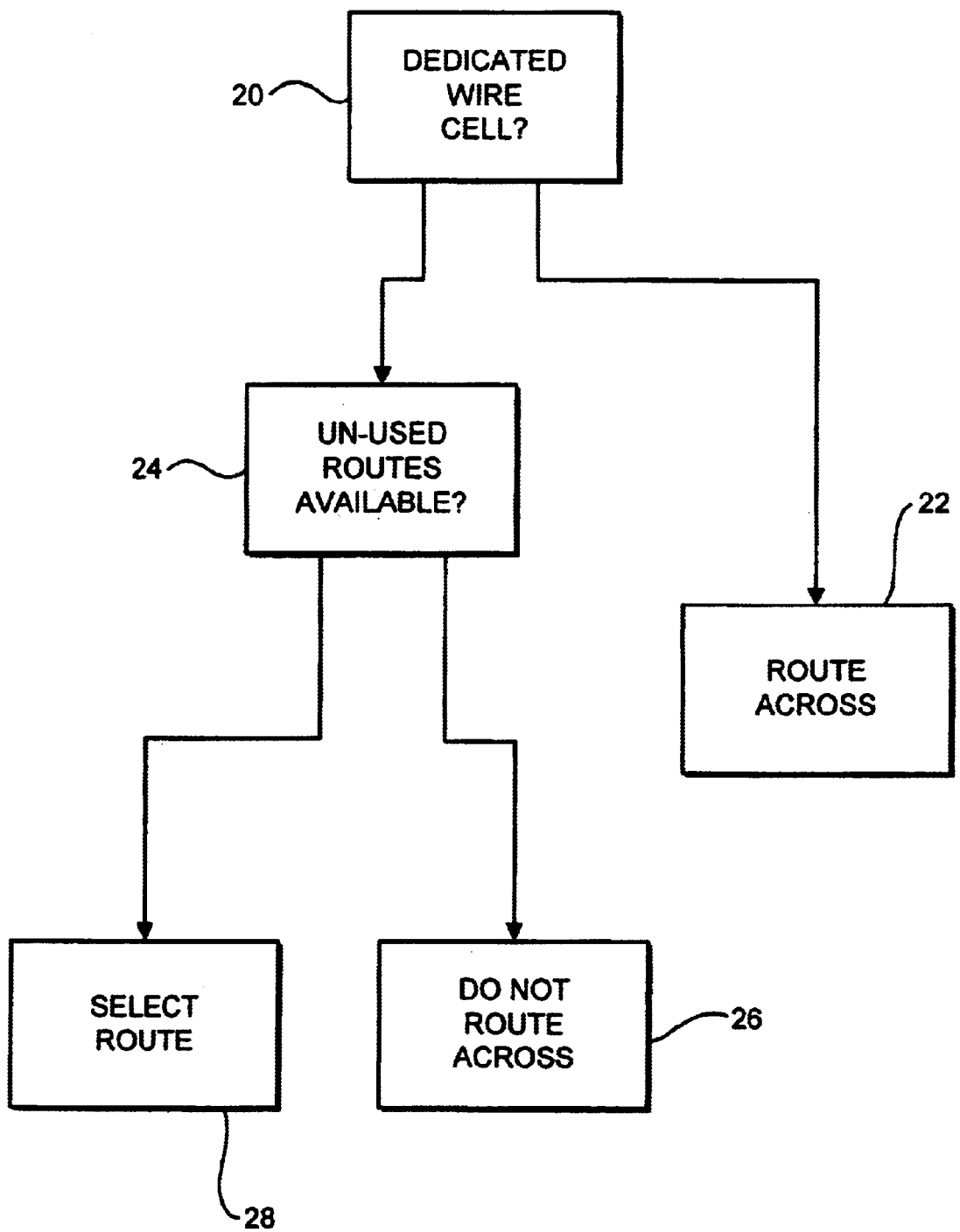
FIG. 4 is a schematic flow diagram illustrating handling of a cell by a router.

FIG. 4 depicts schematically the processing of each cell by the routing software. At step 20, the router determines from the abstracted cell view whether the cell has any dedicated safe routes for wires passing through the cell. If not, the router proceeds to step 22 at which the cell is treated as a non-sensitive cell which can be routed across in accordance with usual cell rules. For example, the cell could be treated as wholly porous (position routes anywhere), or as non-porous (routing across the cell is forbidden).

If at step 20 the router determines that the cell does have dedicated wire routes, then the router proceeds to step 24 to determine whether there are any un-used routes available for the particular metallisation layer being routed. If the available routes have all be used, then the router proceeds to step 26 which indicates that the cell is not available for routing across. If any unused routes are still available, then the router proceeds to step 28 at which the locations of the available wire entry and exit points are examined, and the best entry and exit points are selected according to the router's own requirements. The router will then route on to an entry point of the dedicated in-cell wire, and continue routing on from the exit point.

The above method can be repeated independently for each layer of metallisation such that a cell may be classed as "sensitive" for one metallisation layer, but as "nonsensitive" for another layer. This would enable a cell to use dedicated routes for the sensitive layer, but be routed across at random for the non-sensitive layer. Alternatively, the method may be applied on a multi-layer basis, such that a cell is either classed as sensitive for all layers, or as non-sensitive for all layers.

Figure 5:
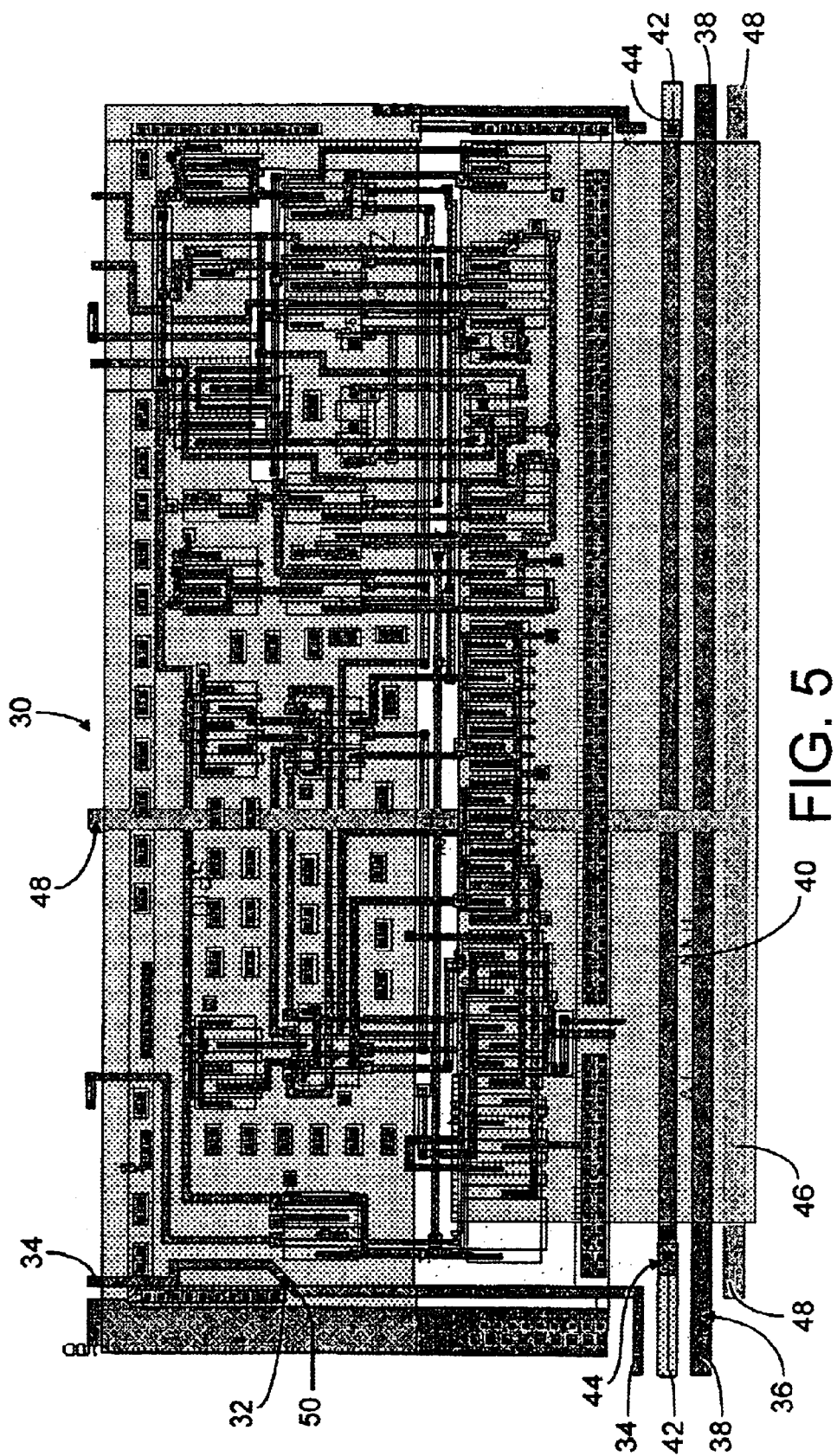
FIG. 5 is a schematic diagram showing a high performance input/output (I/O) cell with wire routes designed as part of the cell.

FIG. 5 depicts a typical sensitive cell 30, in this case a high performance I/O cell, which includes sensitive differential input predriver circuitry. The cell includes a first path 32 on the first metallisation layer between entry/exit points 34, and second additional or alternative path 36 on the first metallisation layer between entry/exit points 38 which can be implemented instead of the first path 32. The cell also includes a third path 40 which has entry and exit points 42 on the second metallisation layer but, in this cell, includes vias 44 to the first metallisation layer such that the route uses the first metallisation layer as it crosses the cell. The cell also includes a fourth path 46 on the third metallisation layer and defining a generally T-shaped route between three entry/exit points 48. The routes are arranged away from the sensitive areas of the cell, which are known to the cell designer.

As can be seen in FIG. 5, the first path 32 includes a diagonal portion 50. Such a shaped path would be extremely difficult to implement using a conventional global router because the router tends to operate using an orthogonal grid pattern. However, by designing the dedicated paths as part of the cell, the cell designer can use greater finesse than could a general global router program.

Figure 6:
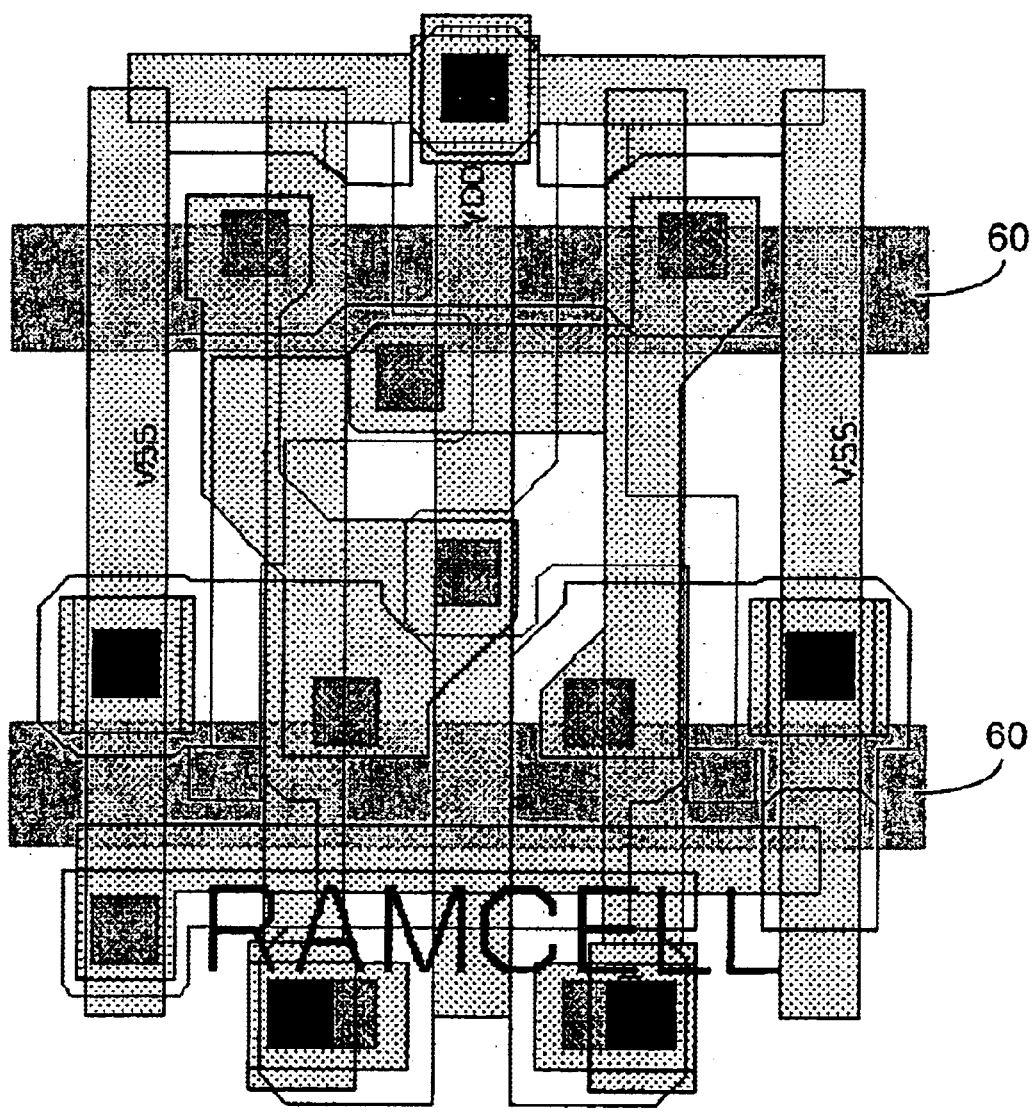
FIG. 6 is a schematic diagram showing a 1-bit SRAM cell.

FIG. 6 illustrates a memory cell, which is generally sensitive across the entire cell area, and so normally is very difficult, or impossible, to route across. In FIG. 6, two routing channels 60 on metal layer M3 are provided. The channels 60 are positioned to cause minimum interference with operation of the cell. In particular, the channels 60 are shown "horizontal" to provide minimum coupling with the signal bit lines which are all orientated "vertically" in the drawing.

The invention is applicable to any types of cell, but is especially suitable for avoiding interference problems for mixed signal cells (Analogue-to-digital converters, digital-to-analog converters, phase locked loop circuits, oscillators, amplifiers, filters, comparators), memories (static RAM, dynamic RAM, and CAM), and high-performance digital cells (low voltage differential signal (LVDS) cells, and pseudo emitter coupled logic (PECL) cells).

It will be appreciated that the invention, particularly as described in the preferred embodiment, can provide the following significant advantages:

(1) The intra-cell wires are no longer constrained by the limitations of the global router.

(2) The cell designer has more control over routing across the cell, especially in sensitive regions of the circuit. Therefore, the designer is less likely to block an entire cell. This allows cell porosity to be improved.

(3) The designer can control the maximum number of tracks placed over the cell, thereby having better control over signal coupling effects.

(4) For differential signals, routing wires may be interspersed horizontally or vertically across the signals for symmetric coupling/decoupling.

(5) The global routing software can be run faster for designs containing many large sensitive cells, since the router no longer needs to route around such cells to bypass them.

(6) The designer can increase the effective porosity of the cell by customising the routing paths, using several metal layers and vias if appropriate.

It will be appreciated that the foregoing description is merely illustrative of a preferred embodiment, and that many modifications may be made within the scope of the invention. Although features believed to be of particular significance have been identified in the following claims, the Applicant claims protection for any novel feature described herein and/or illustrated in the drawings, whether or not emphasis has been placed thereon.

What is claimed is:

1. A method of determining positions of wires in an integrated circuit comprising a plurality of functional circuit cells, the method comprising:

identifying unblocked cells through which wires may be routed, blocked cells through which no wires may be routed, and restricted cells through which routing is restricted to dedicated wire paths, wherein the dedicated wire paths are based on a characteristic of circuitry within the restricted cells;

routing wires through the unblocked cells; and selectively using at least one dedicated wire path through a restricted cell to route a wire.

2. A method according to claim 1, wherein the restricted cell comprises a plurality of alternative wire paths, and the method comprises selecting one of said alternative wire paths according to routing requirements across the restricted cell.

3. A method according to claim 1, wherein the restricted cell comprises a plurality of concurrently usable wire paths, and the method comprises selectively using at least one of said concurrently usable wire paths.

4. A method according to claim 1, wherein the restricted cell has a generally fixed size.

5. A method according to claim 1, wherein said identifying step comprises determining whether any dedicated wire paths exist for a cell and, if not, then classifying the cell as available for routing across in dependence upon default rules for the cell.

6. A method according to claim 1, wherein the method comprises determining whether all of the dedicated wire paths within the restricted cell have been used and, if so, then treating the restricted cell as a cell across which no further wires can be routed.

7. A method according to claim 1, wherein the method is performed by an automated router.

8. A method of designing a functional circuit cell for an integrated circuit, the method comprising:

laying out circuitry within the cell; and including at least one dedicated wire path route through the cell available for use by a wire router, wherein the dedicated wire path route is based on a characteristic of the circuitry within the cell.

9. A method according to claim 8, comprising including a plurality of alternative routes through the cell for use by a wire router.

10. A method according to claim 8, comprising including a plurality of concurrently usable routes through the cell for use by a wire router.

11. A method according to claim 8, comprising including a plurality of routes through the cell for use by a wire router, at least one of the routes being on, or including a portion extending on, a different metallization layer from another route or portion thereof.

12. A method according to claim 8, comprising including at least one route through the cell for use by a wire router which extends on a plurality of metallization layers.

13. A method according to claim 8, comprising including at least one route through the cell for use by a wire router having a diagonal path or portion thereof.

14. A method according to claim 8, wherein the cell has a generally fixed size.

15. A cell for inclusion within an integrated circuit, the cell including:

circuitry within the cell; and at least one dedicated wire path route through the cell available for use by a router, wherein the dedicated wire path route is based on a characteristic of circuitry within the cell.

16. A cell according to claim 15, wherein the cell comprises a plurality of alternative routes through the cell for use by a router.

17. A cell according to claim 15, wherein the cell comprises a plurality of concurrently usable routes through the cell for use by a router.

18. A cell according to claim 15, wherein the cell comprises a plurality of routes through the cell for use by a router, at least one of the routes being on, or including a portion extending on, a different metallization layer from another route or portion thereof.

19. A cell according to claim 15, comprising at least one route through the cell for use by a router which extends on a plurality of metallization layers.

20. A cell according to claim 15, comprising at least one route through the cell for use by a router having a diagonal path or portion thereof.

21. A cell according to claim 15, comprising information about entry/exit points for the dedicated wire path route.

22. A cell according to claim 15, wherein the cell has a generally fixed size.

23. An integrated circuit comprising at least one functional circuit cell, the functional circuit cell comprising:

circuitry within the cell; and at least one dedicated wire path extending through said cell without establishing a functional electrical contact with said cell, wherein the dedicated wire path is based on a characteristic of circuitry within the cell.

24. An integrated circuit according to claim 23, wherein the dedicated wire path is a multi-layer path through said cell.

25. A method according to claim 1, wherein the characteristic is sensitivity to noise.

26. A method according to claim 8, wherein the characteristic is sensitivity to noise.

27. A cell according to claim 15, wherein the characteristic is sensitivity to noise.

28. An integrated circuit according to claim 23, wherein the characteristic is sensitivity to noise.

29. A method according to claim 1, wherein a cell is identified as unblocked for one metallization level and restricted for another metallization level.

30. An integrated circuit according to claim 23, wherein the functional circuit cell comprises a plurality of routes through the cell for use by a router, at least one of the routes being on, or including a portion extending on, a different metallization layer from another route or portion thereof.

* * * * *